United States Patent
Redaelli et al.

(10) Patent No.: US 7,190,621 B2
(45) Date of Patent: Mar. 13, 2007

(54) SENSING SCHEME FOR A NON-VOLATILE SEMICONDUCTOR MEMORY CELL

(75) Inventors: Marco Redaelli, Milan (IT); Luca de Ambroggi, Dresden (DE)

(73) Assignees: Infineon Technologies AG, Munich (DE); Infineon Technologies Flash GmbH & Co. KG, Dresden (DE)

( * ) Notice: Subject to any disclaimer, the term of this patent is extended or adjusted under 35 U.S.C. 154(b) by 21 days.

(21) Appl. No.: 11/145,551

(22) Filed: Jun. 3, 2005

(65) Prior Publication Data

US 2006/0274576 A1 Dec. 7, 2006

(51) Int. Cl.
*G11C 11/34* (2006.01)
*G11C 7/00* (2006.01)

(52) U.S. Cl. .............................. 365/185.2; 365/185.29; 365/189.07; 365/210

(58) Field of Classification Search ............. 365/185.2, 365/185.29, 189.07, 210
See application file for complete search history.

(56) References Cited

U.S. PATENT DOCUMENTS

| | | | |
|---|---|---|---|
| 5,172,338 A | 12/1992 | Mehrotra et al. | |
| 5,508,958 A | 4/1996 | Fazio et al. | |
| 6,011,725 A | 1/2000 | Eitan | |
| 6,055,187 A | 4/2000 | Dallabora et al. | |
| 6,108,259 A | 8/2000 | Choi et al. | |
| 6,151,250 A | 11/2000 | Choi et al. | |
| 6,259,627 B1 * | 7/2001 | Wong | 365/185.21 |
| 6,421,275 B1 | 7/2002 | Chen et al. | |
| 6,449,190 B1 | 9/2002 | Bill | |
| 6,529,405 B2 * | 3/2003 | Chang | 365/185.03 |
| 6,625,057 B2 * | 9/2003 | Iwata | 365/158 |
| 6,639,849 B2 | 10/2003 | Takahashi et al. | |
| 6,674,668 B2 * | 1/2004 | Ikehashi et al. | 365/185.24 |
| 6,690,602 B1 | 2/2004 | Le et al. | |
| 6,807,097 B2 | 10/2004 | Takano et al. | |
| 6,809,969 B2 | 10/2004 | Ohtani et al. | |
| 6,831,872 B2 | 12/2004 | Matsuoka | |
| 7,020,037 B2 | 3/2006 | Anzai et al. | |
| 2002/0001226 A1 | 1/2002 | Banks | |
| 2002/0118566 A1 | 8/2002 | Jong et al. | |
| 2003/0208663 A1 | 11/2003 | Van Buskirk et al. | |
| 2004/0012993 A1 | 1/2004 | Kurihara | |
| 2004/0060031 A1 | 3/2004 | Cernea | |

(Continued)

OTHER PUBLICATIONS

Villa, C., et al., "A 125MHz Burst-Mode Flexible Read-While-Write 256Mbit 2b/c 1.8V NOR Flash Memory," 2005 IEEE International Solid-State Circuits Conference, 0-7803-8904-2/05, pp. 52-53 & 584.

(Continued)

*Primary Examiner*—Son T. Dinh
(74) *Attorney, Agent, or Firm*—Slater & Matsil, L.L.P.

(57) ABSTRACT

A method of sensing a state of a non-volatile semiconductor memory cell is provided. A memory cell current as well as a comparative current generated from at least one reference cell are compared with a predefined reference current while the gate voltages of the cells are varied. Sense amplifiers detect which of said currents first reaches the predefined reference current. The order of reaching the reference current is indicative of the state of the memory cell. In a preferred embodiment of the invention the comparative current is generated as an average of an erased reference cell current and a programmed reference cell current.

18 Claims, 14 Drawing Sheets

U.S. PATENT DOCUMENTS

2004/0076038 A1 4/2004 Ohtani et al.
2004/0090824 A1 5/2004 Takano et al.
2004/0109353 A1 6/2004 Matsuoka
2004/0240269 A1 12/2004 Cernea
2005/0041469 A1 2/2005 Marotta et al.

OTHER PUBLICATIONS

Taub, M., et al., "A 90nm 512Mb 166MHz Multilevel Cell Flash Memory with 1.5Mbyte/s Programming," 2005 IEEE International Solid-State Circuits Conference, 0-7803-8904-2/05, pp. 54-55 & 584.

* cited by examiner

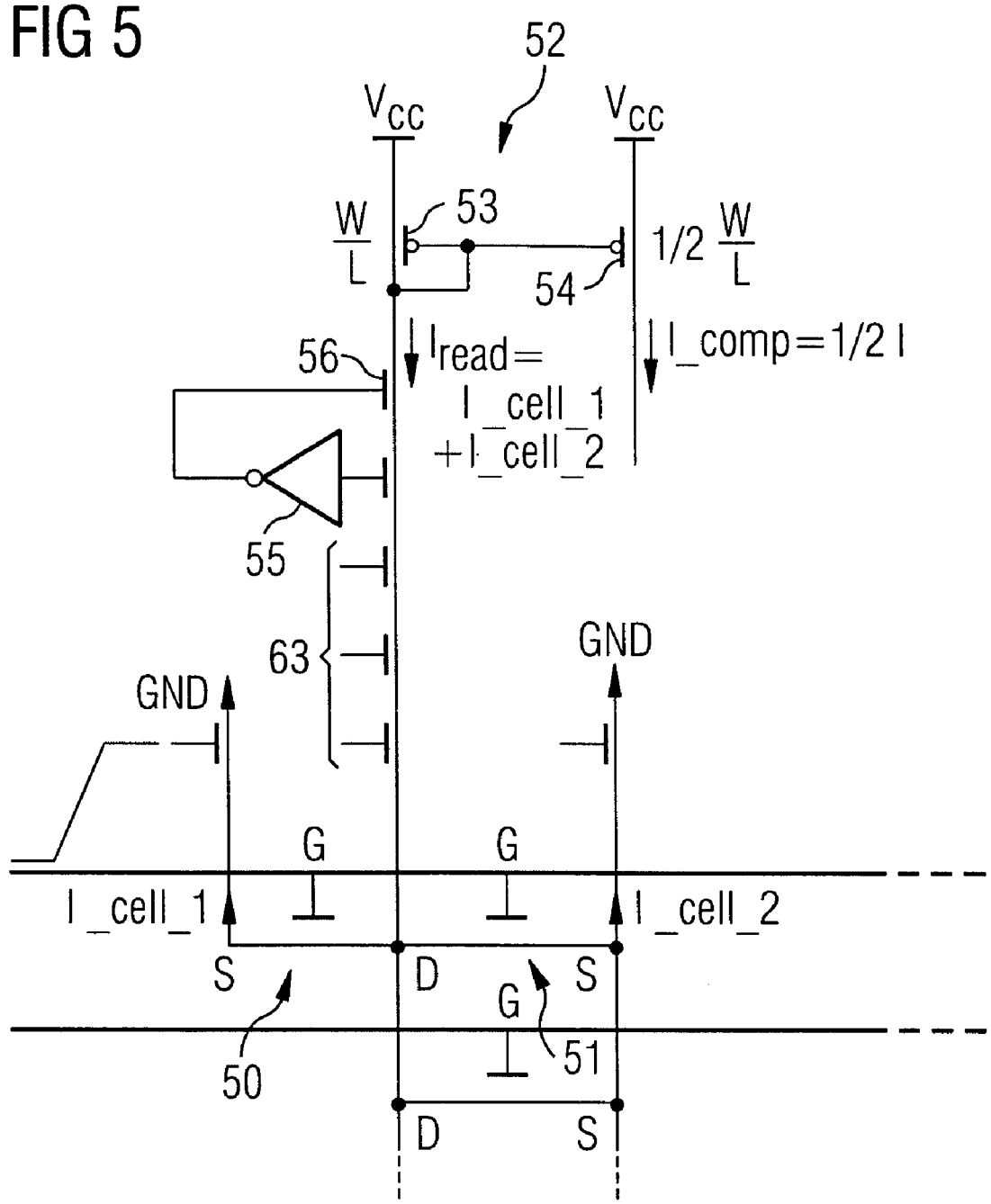

FIG 8

| Out_X_1 | Out_X_0 | Out_X | Comment |
|---|---|---|---|
| 1 | 0 | 1 | strong "1" |
| 0 | 1 | 0 | strong "0" |
| 0 | 0 | | impossible by construction |
| 1 | 1 | indeterminate | Weak "1" or "0" |

| Out_X_1 | Out_X_0 | Row_All1 | Out_X | Comment |
|---|---|---|---|---|
| 1 | 0 | 0 | 1 | strong "1" |
| 0 | 1 | 0 | 0 | strong "0" |
| 0 | 0 | 0 | impossible | by construction |
| 0 | 1 | 0 | indeterminate | Weak "1" or "0" |
| X | X | 1 | 1 | Fully erased row |

SENSING SCHEME FOR A NON-VOLATILE SEMICONDUCTOR MEMORY CELL

TECHNICAL FIELD

The present invention relates to non-volatile semiconductor memory devices such as flash memory devices. More particularly it relates to a sensing arrangement for sensing the state of an individual non-volatile memory cell and to a method of sensing a state of a non-volatile semiconductor memory cell.

BACKGROUND

Flash memories have become more and more popular recently, especially in the area of portable communication devices. The basic structure of a flash memory is similar to that of a MOSFET, including a gate, a drain and a source. Usually a flash memory includes a floating gate and a control gate, as the gate of the MOSFET. In addition, there are some kinds of flash memories with no floating gate, such as a nitride read-only memory (NROM). Differing from other types of flash memory that use a conducting polysilicon or metal floating gate, a nitride read-only memory uses an oxide-nitride-oxide (ONO) layer as a charge-trapping medium. Due to a highly compacted nature of the silicon nitride layer, hot electrons tunneling from the MOS-transistor into the silicon nitride are trapped to form an unequal concentration distribution.

In general, the flash memory has the functions of reading, programming and erasing. When injecting electrons to the floating gate of the memory cell or injecting electrons to the ONO layer of the memory cell, a threshold voltage, at a low voltage initially, of the memory cell increases relatively and results in a current from the drain to the source decreasing. This is the programmed state of the memory cell. While connecting a negative voltage to the control gate, electrons trapped in the floating gate (or trapped in the ONO layer) are removed from the floating gate or the nitride layer to lower the threshold voltage of the memory cell. This is the erased state. Regardless of the state the memory cell is in, it is necessary to operate a reading procedure during which the bit information stored in the memory cell is read.

For reading information stored in a memory cell, two mechanisms are common. In a first mechanism a cell is read by applying predetermined, fixed voltages to the gate and drain input. Its drain/source current is mapped to a memory state by comparing it with a reference current. If the current read is higher than the reference, the cell is determined to be in one logical state (for example a LOW-state). On the other hand, if the current is less than the reference current, the cell is determined to be in the other logical state (for example a HIGH-state). Thus, such a two-state cell stores one bit of digital information.

A second mechanism for sensing the state of a memory cell is to bias the gate of the memory cell with a variable voltage instead of a constant voltage. Here the drain/source current is sensed and compared with a constant current. The gate voltage at which the constant reference current is reached by the measured current indicates the state of the memory cell. For programming and erasing memory cells similar operations are necessary, so called verify operations. Verify operations occur during programming or erasing memory cells, they are reading operations during writing operations that assess a need of a further program or erase pulse in order to properly write the data that is to be written into the cell.

In order to increase memory capacity, flash EEPROM (electrically erasable programmable read only memory) devices are being fabricated with higher and higher density as the state of semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. Thus, the information that a given EEPROM array can store, increases with the number of states that each cell can store. EEPROM or flash EEPROM with multi-state or multi-level memory cells have been described in U.S. Pat. No. 5,172,338, which is incorporated herein by reference.

Another known possibility for increasing the storage density is to store more than one bit on a conducting layer, not distinguishing different amounts of electric charge but to store electric charges in different areas of a gate layer. Such a memory cell is known from the above-mentioned nitride read-only memory devices (NROM). From U.S. Patent Publication No. 2002/0118566, which is incorporated herein by reference, it is known how to read two-bit information in nitride read-only memory cells simultaneously. According to the drain-source current of NROM, a logical two-bit combination message can be identified. The observed current is divided into four different zones and each zone represents a specific logical two-bit information, which is LOW and LOW, LOW and HIGH, HIGH and LOW or HIGH and HIGH.

Storing two bits of information in different regions of the nitride layer has the advantage that the difference between the individual states can be detected easier than in a multi-level memory cell. However, the state of the second bit influences the current flowing through the cell when detecting the state of the first bit and vice-versa. This is also referred to as the second bit effect. The described effect is relevant when reading data but also when verifying data during erase or program operations and therefore must be considered when evaluating a detected cell current. Though the second bit effect is small in comparison with the effect caused by the state of the bit to be read, it can become more important as the operational voltage of the memory cell becomes lower. In order to save power and to allow smaller die structures to be used for a semiconductor circuit, the operational voltages of memory modules are getting lower and lower. Whereas 5V and 3.3V were previously used as supply voltages, new devices use voltages of 1.6V for example.

For reading these flash memory cells, it is essential to sense the conduction current across the source and drain electrodes of the cell. Especially for reading of more than two states of a memory cell it is important to have a reference current that exactly reflects the condition of the memory cell. The more states a memory cell is made to store, the more finely divided its threshold window must be. This will require higher precision in programming and reading operations in order to be able to achieve the required resolution.

The used reference currents are often generated by reference cells that are in a particular state. In most former single-bit or single-level memory architectures, the reference structure for providing appropriate reference currents has been constituted by an array of four or five flash cells corresponding to a programmed state, an erased state, an over-erased or depletion state and a reading state. These reference cells, once programmed to a predefined level, for example at wafer sort, could not be touched anymore.

For several applications, for example for archiving data, it is important that data can still be correctly read after a long time or large number of writing cycles. In addition, temperature variations are to be considered. These influences affect the currents read from a memory cell. Temperature variations also influence the reference currents. In typical single-level and single-bit devices the margins set to separate the states of a memory cell define big windows for the different states. The windows are big enough to secure that data is correctly read or written under all conditions. In multi-level and multi-bit memories, the windows have been significantly reduced and it has become a problem to ensure a correct functionality under all environmental conditions and over the whole life period. The respective need of more accurate references is illustrated in FIGS. 18, 19 and 20.

The diagram of FIG. 18 relates to a two-state memory cell for storing one bit of data. It shows the voltages and currents in an NROM memory cell. The current ICELL through the memory cell depends on the gate-source-voltage. A lower threshold 121 defines the beginning of an erased state. Below the erased state there is an over-erased state, also called a depletion state. In this state, which is not allowed in normal operation of the memory cell, a current flows from the drain to the source even if no voltage is applied to the gate. The erased and the programmed states are separated by a reference voltage 122. The margin windows for the erased and the programmed state are big enough to fit for all conditions.

FIG. 19 shows that in a multi-level cell the margin windows for all states are reduced. For each of the different states a threshold voltage 121, 123, 124 and 125 is defined. This makes clear that the references 121, 123, 124 and 125 must be more accurate than the references 121 and 122 in the diagram of FIG. 18.

From FIG. 20 it can be seen that in multi-bit memory cells an additional problem arises. When reading the first bit of the memory cell it must be considered that the characteristic depends on the second bit. Without consideration of the second bit effect a logical "1" is detected, when the gate-source voltage is in the range referred to as 126. The range of a logical "0" is referred to as 129. A threshold voltage is referred to as 128. When the second bit effect is considered, a logical "1" is to be detected even if the gate-source voltage is higher than the range 126. The excess range is referred to as 127. Therefore the consideration of the second bit effect further reduces the margin window for detecting the state of the memory cell.

To summarize, there are several effects that require that the reference current or voltage for detecting the logical state of a memory cell are more accurate. This is required not only when first operating the memory device but also over its complete lifetime, when degrading effects change the behavior of the memory cells.

Apart from these specific problems there is a general need for high performance, high capacity and high reliability of non-volatile memory devices. In particular, there is a need to have compact non-volatile memory devices. These compact non-volatile memory devices should have a memory system that minimizes disturbance effects.

SUMMARY OF THE INVENTION

In one aspect, the present invention provides a non-volatile semiconductor memory device and a respective method for operating a memory device with a better sensing scheme. Embodiments of the present invention propose to compare each of a memory cell current and a comparative current generated from at least one reference cell current with a predefined reference current. It is detected by means of sense amplifiers and an evaluation circuit, which of the currents first reaches the predefined reference current. The order of reaching the reference current is indicative of the state of the memory cell.

In a preferred embodiment of the invention the comparative current is generated as an average of an erased reference cell current and a programmed reference cell current. This assures that over the lifetime of the memory device the comparative current is always situated between the currents of a programmed cell and an erased cell, i.e., in exactly the middle between these currents.

In a further improved embodiment of the invention, for each wordline an additional status cell is provided. In this status cell, named "Row Guard Reference," an information is stored by a first logical state indicating if one of the memory cells associated to the respective wordline is programmed. Otherwise all memory cells associated to the word line are erased which is indicated by the other logical state.

It is an advantage of the current invention that sense amplifiers can be designed to conduct a comparison with a constant current. This enables a low current consumption of the sense amplifiers and less area consumption.

When one of the currents, in particular the comparative current, has reached the predefined reference current, the further variation of the gate voltages can be stopped and, therefore, a further increase of the cell currents can be prevented. This reduces stress to the memory cells and to the sense amplifiers. The lifetime of the memory device is prolonged and power consumption is reduced.

The use of an erased reference cell and a programmed reference cell for generating a comparative current has the advantage that a different degrade of a programmed and an erased reference cell is subject to the memory cells and the reference cells. Therefore, the comparative current always fits with the characteristics of memory cell currents also after of a movement of these characteristics caused by degrade.

It is a further advantage of embodiments of the present invention that the proposed reference scheme can be applied to all types of volatile memory devices.

These and other advantages of embodiments of the present invention will become obvious to those of ordinary skill in the art after reading the following detailed description of the preferred embodiments, which is illustrated in the various figures and drawings.

BRIEF DESCRIPTION OF THE DRAWINGS

For a more complete understanding of the present invention, and the advantages thereof, reference is now made to the following descriptions taken in conjunction with the accompanying drawing, in which:

FIG. 5 is schematic of a comparative current generating circuit;

FIG. 8 is a table with signal states of the circuit from FIG. 7;

DETAILED DESCRIPTION OF ILLUSTRATIVE EMBODIMENTS

Embodiments of the present invention will be described more specifically with reference to the drawings. In the figures, identical or similar components are denoted by identical numerals and their description will not be repeated.

Non-volatile semiconductor memory devices that are electrically re-writable and erasable are referred to as EEPROMs or NROMs as mentioned previously.

Figure 1:
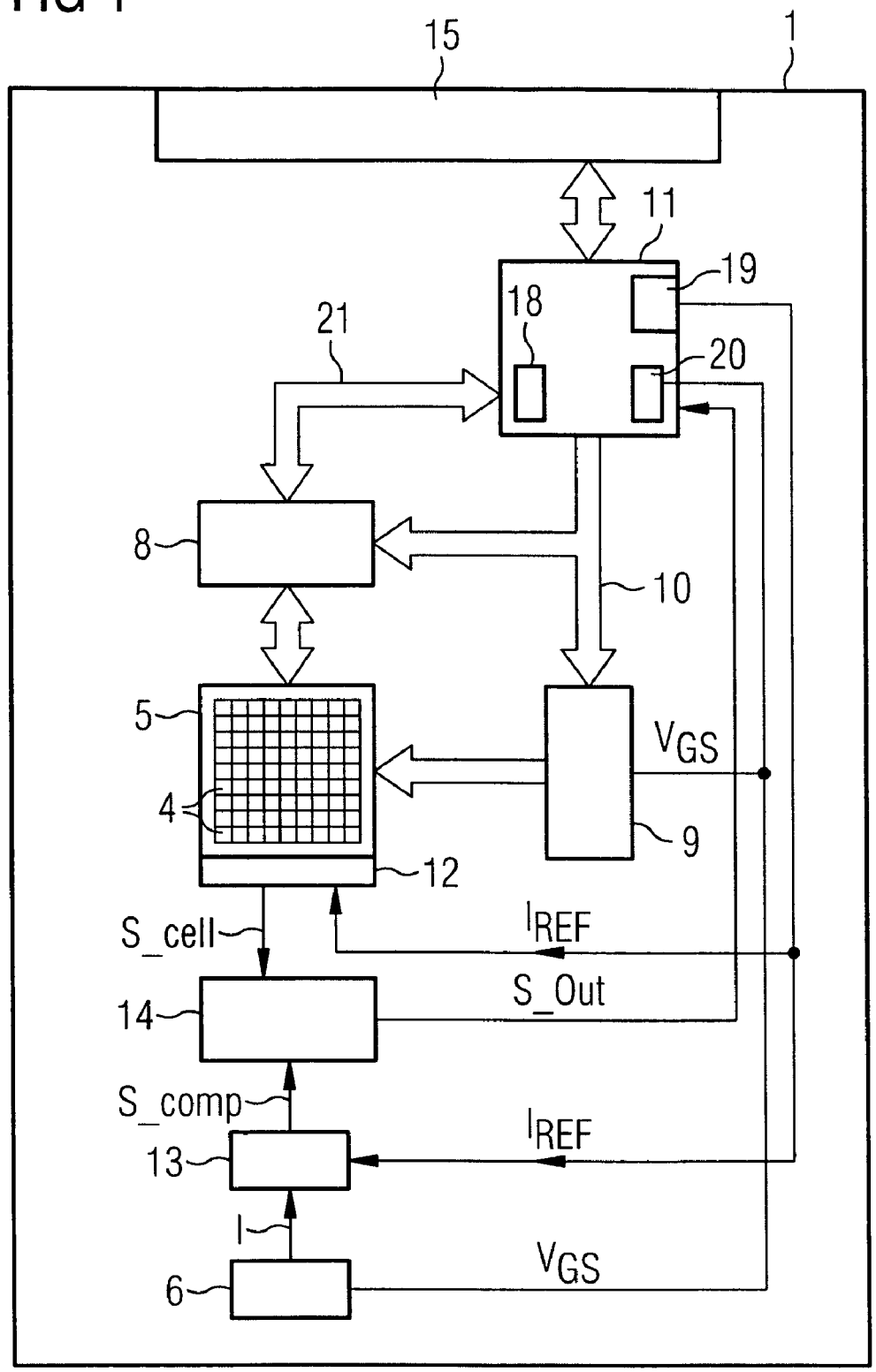
FIG. 1 is a schematic diagram of a flash memory circuit according to the present invention.

FIG. 1 is a block diagram showing a configuration of a flash memory device 1 that uses NROM memory cells for storing data. A memory array 5 comprises a plurality of memory cells 4. The memory cells are arranged in columns and rows and, therefore, constitute a matrix. Each of the memory cells can be selected by means of a column decoder 8 and a row decoder 9. Both decoders are connected to an address bus 10, which is also connected to a control unit 11. The control unit 11 is connected to an I/O-interface 15 for receiving data from an external device and sending data to an external device. For example, for reading data stored in the memory device the control unit 11 accesses the memory array 5 by sending an address to the column decoder 8 and the row decoder 9. The column decoder 8 extracts information as to which of the bitlines of the memory array 5 are to be selected. The row decoder 9 selects a wordline, corresponding to the address transmitted from the control unit 11. Data are transmitted between the control unit 11 and the memory array 5 over a data bus 21. For reading and writing data, the control unit 11 also comprises writing and reading circuits 18 to perform operations on the memory array 5.

The control unit 11 of the circuit arrangement in FIG. 1 additionally comprises a gate voltage generating circuit 20 and a reference current generating circuit 19. The gate voltage generating circuit 20 is connected to the row decoder 9 and applies a defined gate voltage V_GS to the gates of selected memory cells 4. The reference current generating circuit 19 is connected to sense amplifiers 12 and 13 and generates the reference current I_REF, which is used by the sense amplifiers 12 and 13. While data transmitted over the address bus 10 define which wordline or wordlines are selected, the gate voltage generating circuit 20 controls the exact voltage V_GS that is applied to the wordlines.

For reading a memory cell 4, it is necessary to compare a current flowing through that cell 4 with a comparative current that is derived from a current flowing through one or multiple reference cells 6 as explained below. According to the invention, the comparison is done indirectly by comparing the respective currents with a predefined constant reference current.

Figure 2:
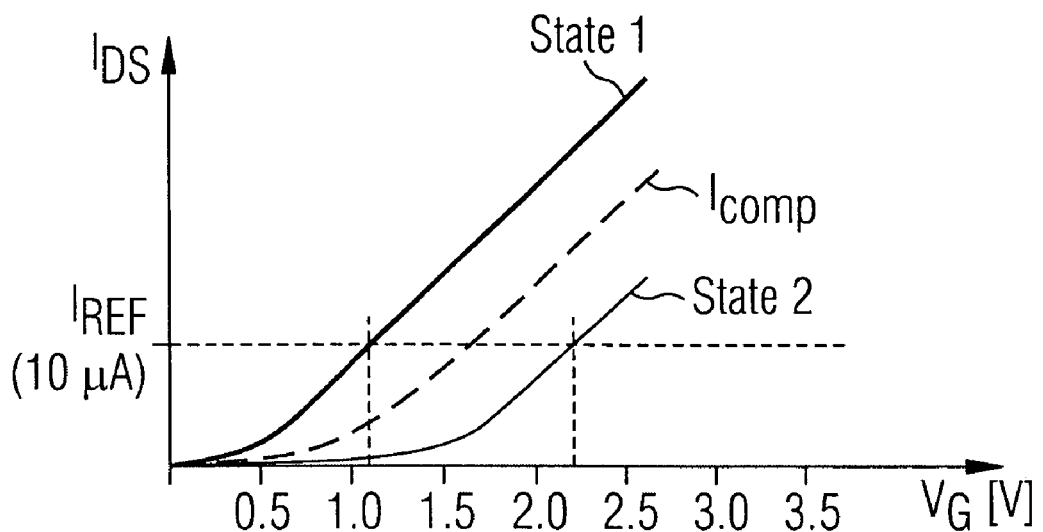
FIG. 2 is a graph illustrating the characteristics of a two-state memory cell.

FIG. 2 is a graph for a typical memory or reference cell. Depending on the state of the memory cell, the cell current reaches a reference current (which is 10 µA in this example) at a gate-source voltage V_GS of 1.1 V or 2.2 V. Assuming that the gate-source voltage V_GS is increased with time, the time when the reference current I_REF is reached indicates the state of the memory cell.

The same comparison is done for a comparative current I_comp, which is shown in FIG. 2 as a dashed line. It is an average of the cell currents of a programmed cell (state 2) and an erased cell (state 1).

Since both currents are compared to the reference current I_REF, the comparison results deliver information about the state of the sensed memory cell. This is done by the sense amplifiers 12 and 13. The sense amplifier 12 is a memory cell sense amplifier that is connected to the bitlines of the memory cell 5. The sense amplifier 13 is a reference cell sense amplifier that is connected to the bitlines of the reference cell 6. The memory cell sense amplifier 12 is provided for measuring a current through the memory cells of the memory array 5 and comparing it with a reference current I_REF. The reference sense amplifier 13 is provided for measuring a current through the reference cells 6. The memory cell sense amplifier 12 outputs a signal s_cell indicating when the memory cell current I_cell reaches the reference current I_REF. The reference cell sense amplifier 13 outputs a signal s_comp indicating when the comparative current I_comp reaches the reference current I_REF.

An evaluation circuit 14 is connected to the memory cell sense amplifier 12 and to the reference cell sense amplifier 13. By comparing the signals received from the sense amplifiers 12 and 13, a result signal s_out is generated that indicates the logical state of the selected memory cell. The evaluation circuit 14 is connected to the control unit 11. The connection is drawn in FIG. 1 as a separate line but the logical state of a memory cell as it is evaluated by the evaluation circuit 14 (e.g., the data written to the memory cell) can also be transmitted using the data bus 21.

This procedure for reading the logical state of a memory cell is carried out each time the stored data is requested, for example, by a host system, which is connected to the I/O-interface 15, or if the state of a memory cell is to be verified, and therefore, to be read after an erasing or a programming operation.

In the context of this application writing means to set the state of a memory cell to an erased or a programmed state. Programming means to set the state to a first logical value and erasing means to set the state to a second logical value.

Figure 3A:
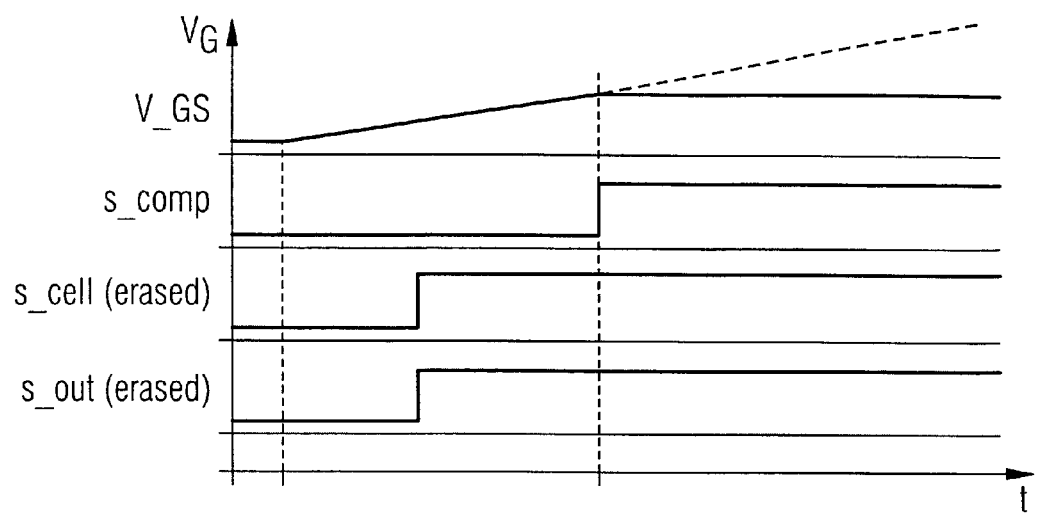
FIGS. 3A and 3B are timing diagrams of the circuit from FIG. 1 reading "1" or "0", respectively.
Figure 3B:
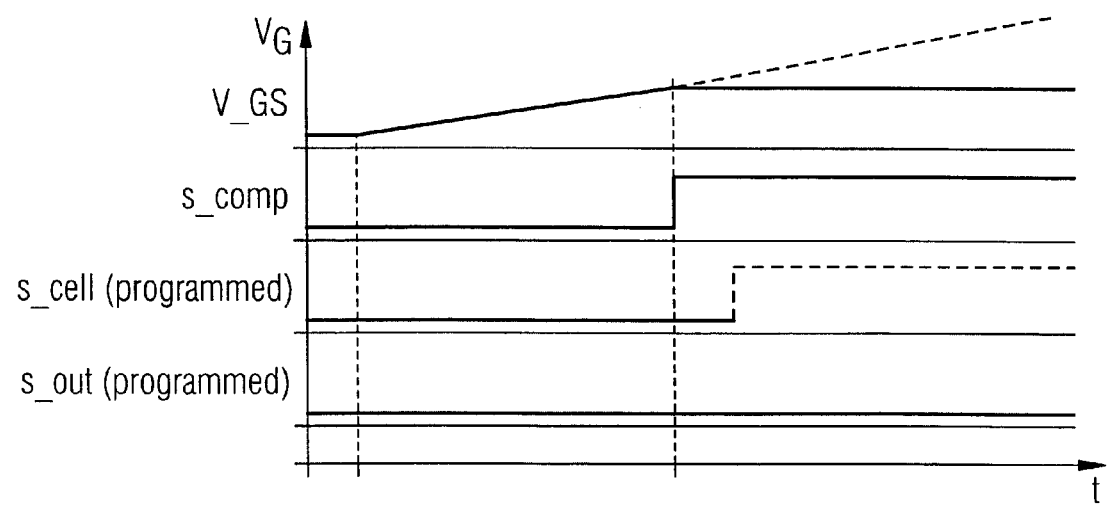

FIGS. 3A and 3B are time diagrams showing how the evaluation circuit 14 works. The voltage V_GS, which is applied to the gates of memory cells and reference cells, increases with time. When the gate voltage V_GS reaches a first threshold value the current of an erased memory cell becomes higher than the reference current I_REF, which is indicated by the signal s_cell in FIG. 3A. If this happens before the comparative current I_comp has reached the reference current I_REF and the signal s_comp flips to HIGH, the evaluation circuit 14 outputs a HIGH signal.

If the memory cell is programmed as shown in FIG. 3B, the comparative current I_comp reaches the reference current I_REF prior to the memory cell current. Therefore, after the signal s_comp switching to HIGH, the output of the evaluation circuit 14 keeps on a LOW level. The sensing can be stopped and the gate voltage V_GS is not further increased, but discharged to reduce voltage stress to the memory cell.

Hypothetically, if the gate voltage of the memory cell was further increased as indicated by the dashed line of V_GS, the signal s_cell would also switch to HIGH when the memory cell current becomes greater than the reference current I_REF. However, this would give no additional information and for reasons of current consumption and to avoid high stress to the memory cell, the sensing is stopped at the time when the comparative current I_comp reaches the reference current I_REF.

Figure 4:
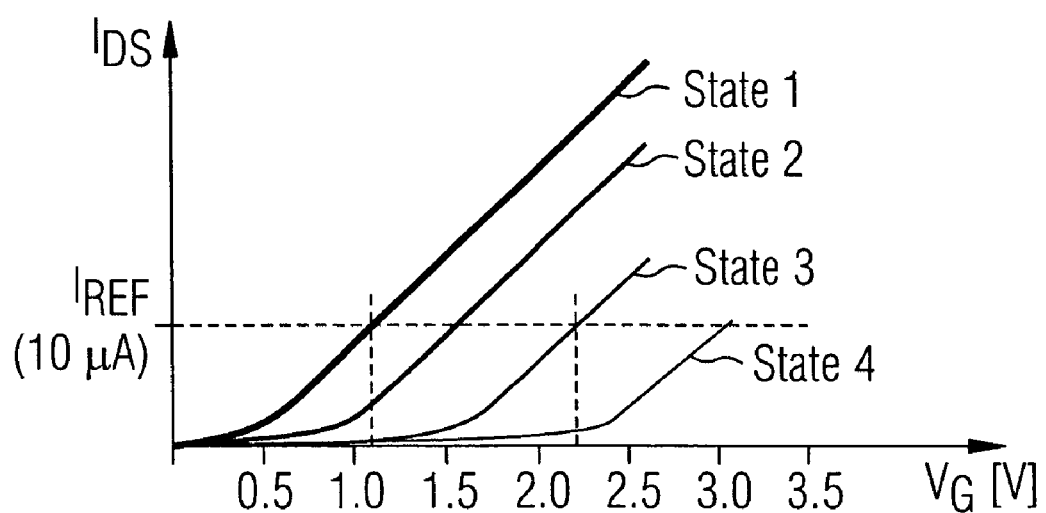
FIG. 4 is a graph illustrating the characteristics of a two-state memory cell.

As mentioned above, it is necessary, especially for highly integrated memory devices, to provide a reference value that is very exact in order to enable a sharp and tight program/erase differentiation. This is particularly important if more than two states are to be detected as is the case using two-bit NROM cells. The need of an accurate comparative current is illustrated in FIG. 4. In this graph four possible states of a memory cell are to be detected. In a real memory device the characteristics are not equal for all memory cells. Therefore, the curve for each of the states is not a single line but a statistically distributed field of lines. For example the highest V_GS value for state 1 is very close to the lowest V_GS value for state 2. As mentioned above, the characteristics may change with time, writing cycles and environmental conditions. The behavior of a programmed cell is different from the behavior of an erased cell. Since supply voltages decreased in the last years and are still decreasing, the detection of the state of a memory cell became more difficult. As a consequence, reading errors became more likely. To overcome this problem in some cases the performance of the memory device had to be slowed down.

According to a preferred embodiment of the invention, the comparative current I_comp is not generated by a single reference cell, which is programmed to have a threshold voltage that is between the threshold voltages of an erased memory cell and a programmed reference cell. To provide a better comparative current I_comp, two reference cells are used. One is set to a programmed status and the other is set to an erased status. The comparative current is a composition of the cell currents of both memory cells. While the programmed reference cell behaves like a programmed memory cell, the erased reference cell behaves like an erased memory cell. The comparative current is therefore always between the characteristics of an erased and a programmed memory cell. The comparative current can be calculated by the equation:

$$I\_comp=(I\_erased+I\_programmed)/x,$$

I_comp being the comparative current, I_erased the cell current of an erased memory cell, I_programmed the cell current of a programmed memory cell and x an average coefficient. Good values for x are between 3.0 and 1.5.

The x-coefficient can be freely chosen according to practical considerations. As an example I_erased is 5 µA, I_programmed is 20 µA, x is 2.5. The comparative current is then calculated to 10 µA.

The generation of an average comparative current can be done with an average generating circuit according to FIG. 5.

The comparative current I_comp is generated as an average of currents through an erased reference cell 50 and a programmed reference cell 51. Both reference cells 50 and 51 are read in common using the same bitline. The bitline current I_READ is, therefore, the sum of the current I_cell_1 through the erased reference cell 50 and the current I_cell_2 through the programmed reference cell 51.

A current mirror 52 is provided with a reference transistor 53, which is configured as a diode. The reference transistor 53 is connected to the bitline and, therefore, mirrors the bitline current to a second transistor 54 of the current mirror 52. The current through the second transistor 54 is the comparative current I_comp. By the configuration of the current mirror the ratio between the comparative current I_comp and the bitline current I_read can be adjusted. To achieve a respective ration different geometric properties, i.e., a different length L and width W of the channel, can be used for the transistors 53 and 54 of the current mirror. In the present example the ratio is 1/2.

A control amplifier 55 is provided for keeping the voltage at the drains of transistors 50 and 51 constant when reading as it will be described with reference to the schematic from FIG. 6.

Figure 6:
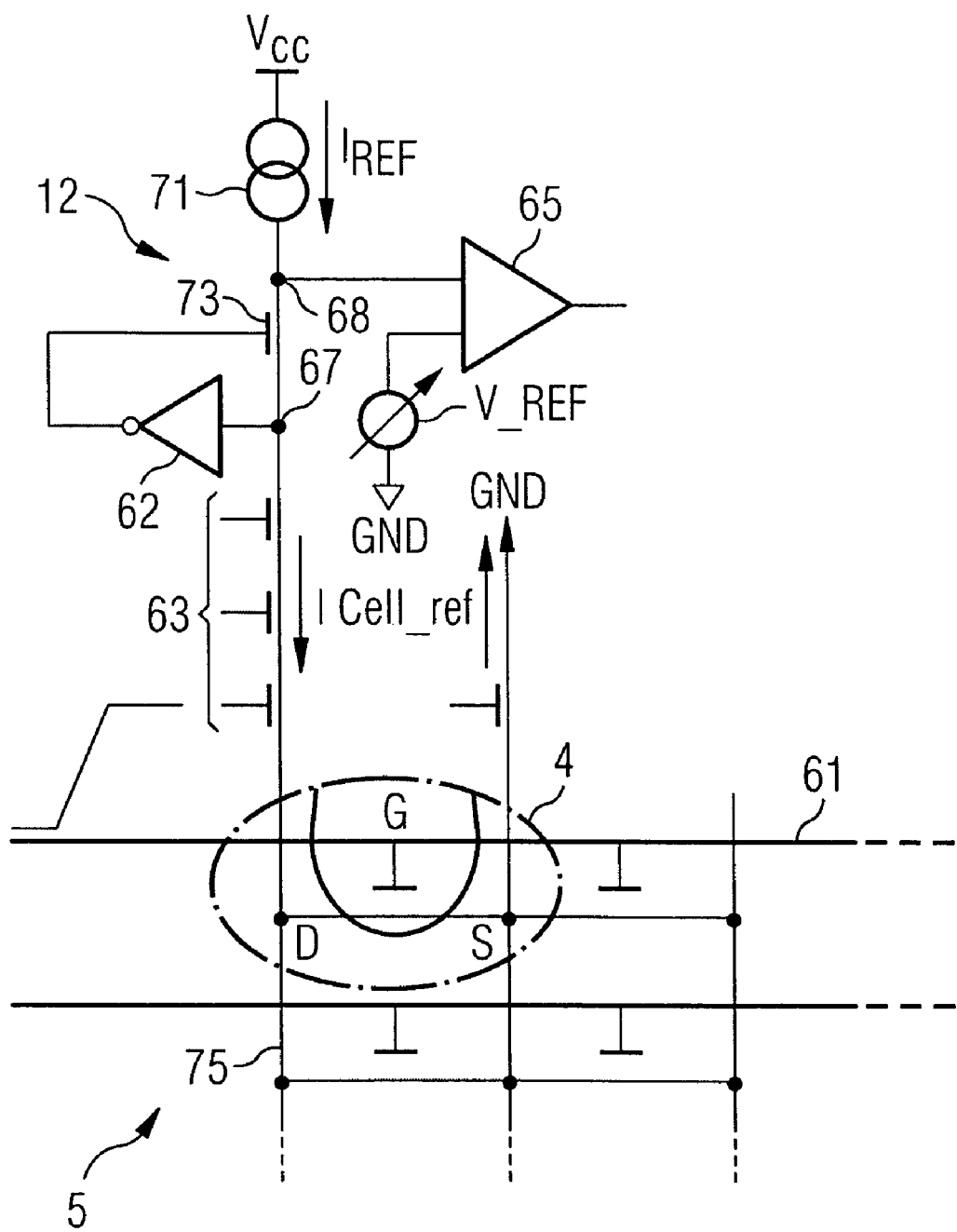
FIG. 6 shows a schematic drawing of an array reference cell and a memory cell.

FIG. 6 is a schematic of an exemplary circuit diagram that shows a memory cell 4 of the memory array 5 with an assigned sense amplifier 12. Using a wordline 61 the gate of the transistors 4 is biased. For selecting the memory cell 4 that is formed by the shown transistor, the bitline 75 is also to be selected. This is done by decoders 63, which are the column decoders. If all switch transistors of the decoder 63 are closed, the voltage at a node 67 of the memory cell is applied to the drain of transistor 4.

After closing the switches of the decoder 63, a current I_cell starts flowing from the node 67 over the drain and source of the transistor 6 to ground node GND. The current I_cell depends on the conductivity of the channel from the drain to the source electrode of the transistor 4. The conductivity depends on the charge that is situated on the nitride layer of the memory cell 4, which is an NROM cell in this embodiment of the invention. In other words, the current depends on the state of the memory cell 4, if the voltage at node 67 is constant. For this purpose a control amplifier 62 is provided, which receives at an input the voltage at node 67. The control amplifier 62 controls a further transistor 73 that is connected between node 67 and node 68. Node 68 is also connected to an input of a comparator 65 and a current source 71, which is adjusted to a reference current I_REF. By the control amplifier 62 it is assured that the voltage at node 67 is kept constant, independent of the cell current I_cell.

The comparator 65 has another input to which a reference voltage V_REF is applied. Voltage V_REF is used as a comparative voltage for the voltages at node 68. It is sized properly according to the dynamic of nodes 68 and 70. The voltage at node 68 depends on the current I_cell and the reference current I_REF. If the current I_cell is higher than the current I_REF, the comparator 65 outputs a HIGH-signal, otherwise it outputs a LOW-signal.

When the memory cell 4—which is shown as an example for a plurality of memory cells—is read by applying an appropriate gate voltage to the memory cell 4, the cell current I_cell rises due to an increased conductivity of the memory cell 4. This happens under the precondition that the drain-source voltage, which is the voltage at node 67, is kept constant. This is done by sensing the voltage at node 67 and controlling the gate voltage of transistor 73 in order to increase its conductivity. Since the current source 71 remains unchanged, the voltage at node 68 decreases. If the gate voltage applied to the memory cell is high enough, the cell current I_cell becomes greater than a threshold, the voltage at node 68 falls under the voltage V_REF and the comparator 65 flips.

The same procedures happen for a reference cell that is not shown in FIG. 6. Assuming that the gate voltages of the memory cell 4 and the reference cell are varied simultaneously, i.e., linearly increased, both a reference cell comparator 65 and the memory cell comparator 65 will flip but at different times. The information which comparator flips first is indicative of the state of the memory cell.

Figure 7:
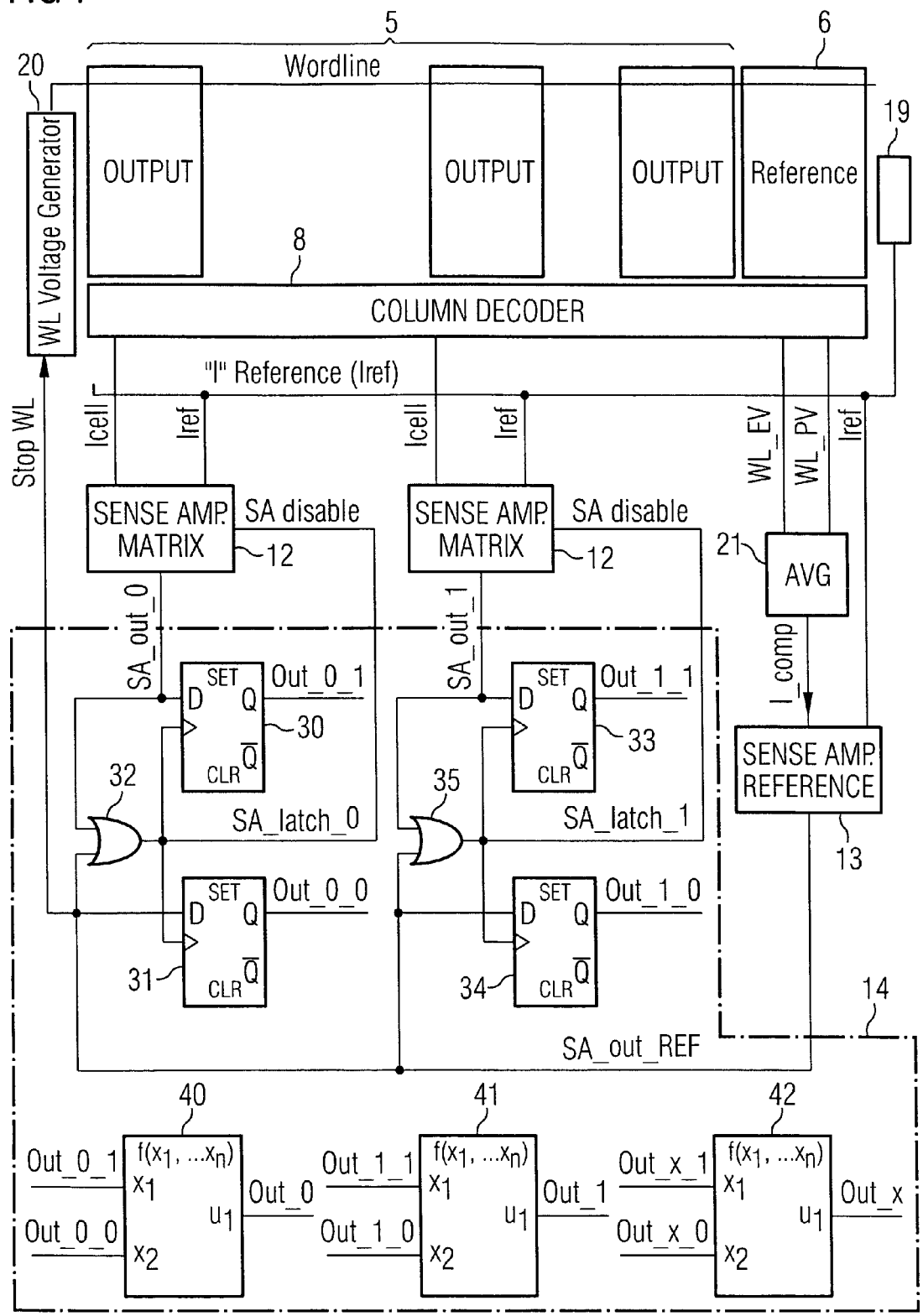
FIG. 7 is a detailed schematic of an evaluation circuit.

FIGS. 7 and 8 are an example of a first embodiment of the present invention.

FIG. 7 is a schematic of a circuit arrangement with a memory array 5, reference cells 6, a reference current generating circuit 19, a gate voltage generating circuit 20, sense amplifiers 12 and 13 and evaluation circuit 14. The cited components are connected and work as described for FIG. 1. The evaluation circuit 14 is now described in detail. The relation between logical signals is additionally shown in FIG. 8.

The evaluation circuit 14 comprises a plurality of D-type flip-flops 30, 31, 33 and 34. For a selected bitline, a set of two flip-flops is provided. Usually a column decoder selects one bitline at a particular time. The outputs of each memory cell sense amplifier 12 are connected to a D-input of first flip-flops 30 and 33 and also to a first input of OR-gates 32 and 35, which are also provided for each bitline. The output of the array reference cell sense amplifier 13 is connected to a D-input of second flip-flops 31 and 34 and also to a second input of OR-gates 32 and 35. The outputs of the OR-gates 32 and 35 are each connected to a clock input of the flip-flops assigned to the same bitline. Additionally, the outputs are each connected to the associated memory cell sense amplifier 12 in order to disable the respective sense amplifier when a clock pulse has been generated by the OR-gate. The output of the array reference cell sense amplifier is additionally connected to voltage generating circuit 20. The outputs of each set of flip-flops are connected to output units 40, 41 or 42, which combine the output signals of each set of flip-flops in order to generate an output signal OUT_0, OUT_1 or OUT_X.

The array evaluation circuit 14 works as follows. An output signal SA_OUT_0 of the first memory cell sense amplifier 12 indicates that the cell current has reached the reference current. If the respective memory cell is erased, the cell current I_cell reaches the reference current I_REF before a comparative current reaches the reference current I_REF and the sense amplifier 12 outputs a logical '1' that is applied to the D-input of the first flip-flop 30. At the same time a logical '0' is applied to the D-input of the second flip-flop 31 since the comparative current I_comp has not yet reached the reference current I_REF. At the inputs of the OR-gate 32 a logical '1' and a logical '0' are received. Therefore, at the output a logical '1' is generated and applied to the clock inputs of the flip-flops 30 and 31. The input values at the D-inputs are taken over to the outputs Q and, therefore, the first output signal OUT_0_1 indicates a logical '1' and the second output signal OUT_0_0 indicates a logical '0'. These output signals are combined in the output unit 40 and an output signal OUT_0 at a logical '1' is generated indicating an erased state of the sensed memory cell. The sensing results for different operation situations are listed in the table of FIG. 8.

Figure 12:
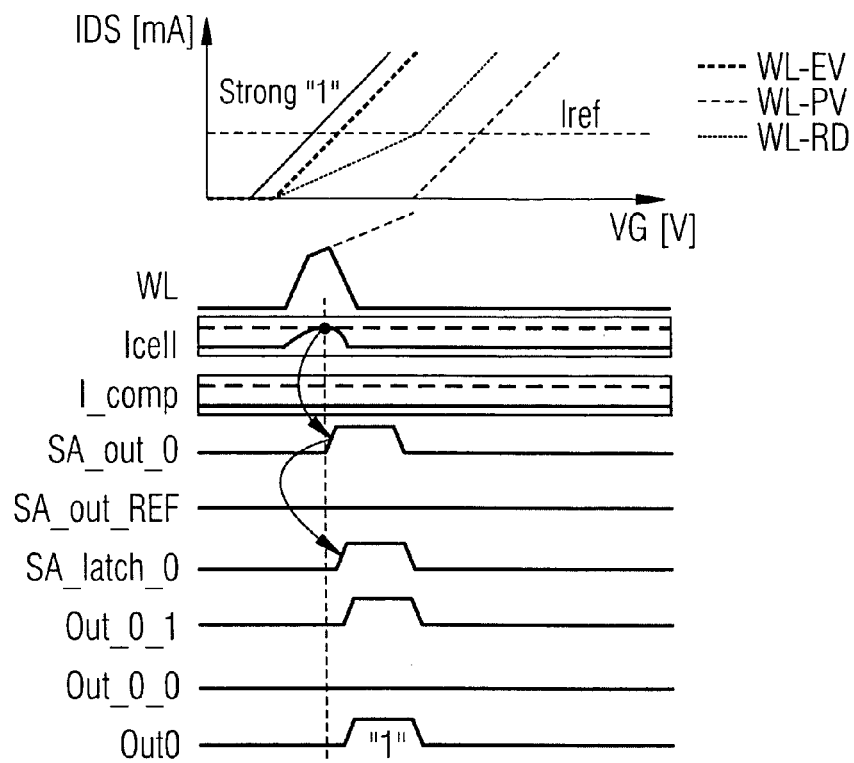
FIGS. 12 to 15 are timing diagrams for the circuits from FIGS. 7 and 9.

A timing diagram for this case can be seen in FIG. 12. The signal WL stands for the voltage that is applied to the gates of the sensed memory cell and the reference cells. In this case, where the threshold voltage of the sensed memory cell corresponds to a strong logical '1', the cell current I_cell reaches the reference current before the comparative current I_comp rises significantly. The signal SA_OUT_0 at the output of the OR-gate 32 rises as a consequence and a short time later the output signal OUT_0_1 of the flip-flop 30 rises to a logical '1'. The output signal OUT_0 of the output unit 40 indicates a logical '1' a short time later.

A second operating situation is given when the sensed memory cell is programmed to a strong '0'. In this case the comparative current I_comp reaches the reference current I_REF before the cell current significantly rises. Therefore, the output signal OUT_0_0 of the flip-flop 31 flips before the cell current I_cell reaches the reference current I_REF. The output unit 40 outputs a logical '0'.

Figure 13:
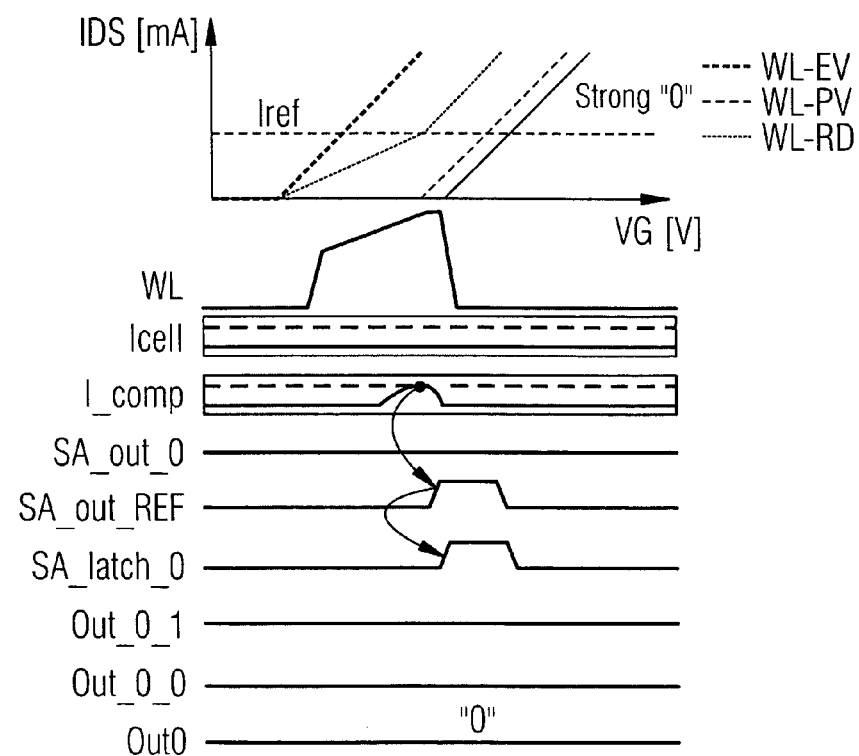

As can be seen in FIG. 13 it can take a relatively long time until the comparative current reaches the reference current. However, in both cases the current that first reaches the reference current becomes no higher than the reference current itself (i.e., 10 µA), since the sense amplifier 12 for the concerned bitline is stopped when the assigned flip-flop outputs a '1'.

Referring to the table of FIG. 8, it must be mentioned that the signal combination 0—0 for the output signals OUT_X_1 and OUT_X_0 is not possible. The gate voltage rises until the comparative current I_comp reaches the reference current I_REF. Therefore, it is assured that the signal SA_OUT_REF becomes sometime a logical '1', which leads to a logical '1' at the output Q of the flip-flop 31.

Figure 14:
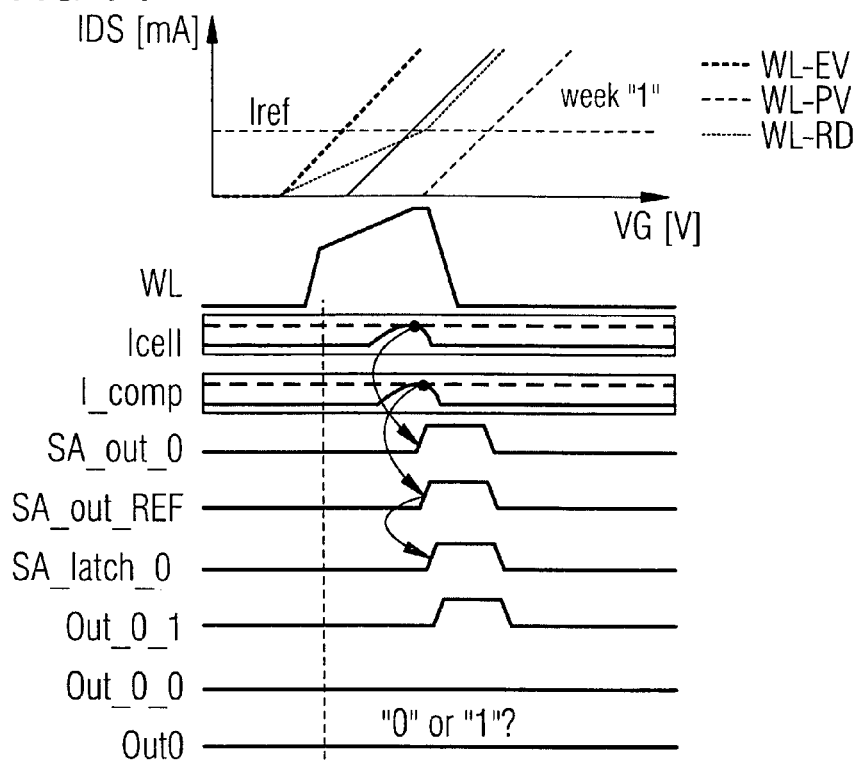
Figure 15:
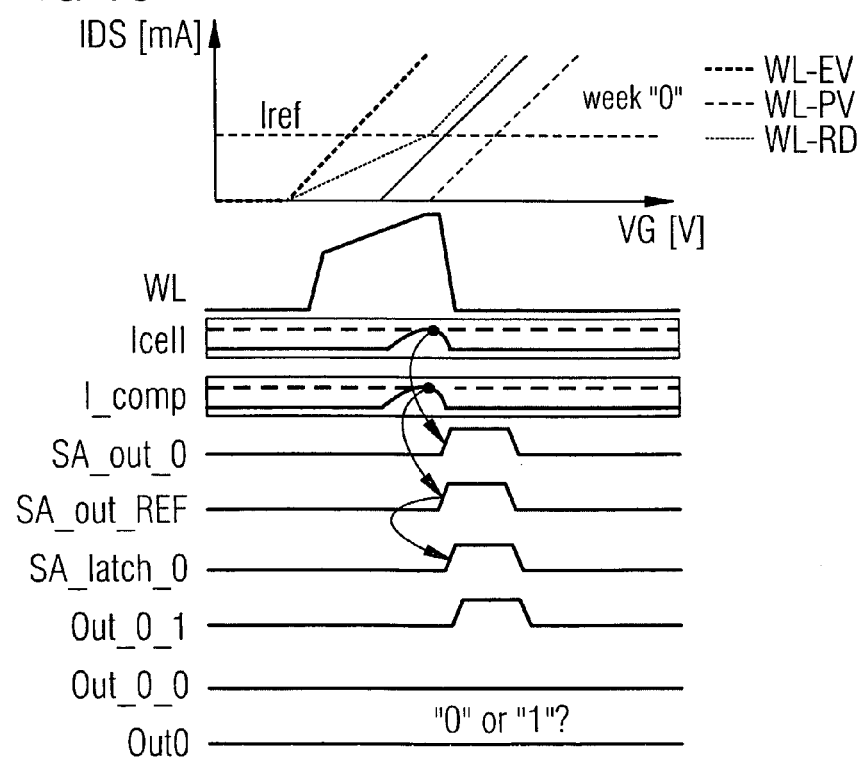

In the case that the memory cell has a threshold voltage corresponding to a weak '1' or a weak '0' (see FIGS. 14 and 15) things become more complicated. As mentioned above, the gate voltage stops rising when the reference sense amplifier 13 detects that the comparative I_comp is equal to the reference current I_REF. If the state of the sensed memory cell is a weak '1' or a weak '0', this point of time is very close to a time when the cell current I_cell reaches the reference current I_REF that is detected by the memory cell sense amplifier 12. Considering the time delay of the flip-flops and the OR-gates, it cannot be unambiguously seen from the output signals how the input signals are. However, taking into account all phenomena related to NROM cells, it is more likely that the logical state is a '1' when the actual state cannot be clearly detected.

The operation has been described for the first bitline comprising the flip-flops 30 and 31 and the OR-gate 32. The circuit arrangements provided for the other bitlines work in the same way.

The comparative current I_comp is generated by an average generating circuit 21 that works in the same way as it was described with respect to FIG. 5.

Figure 9:
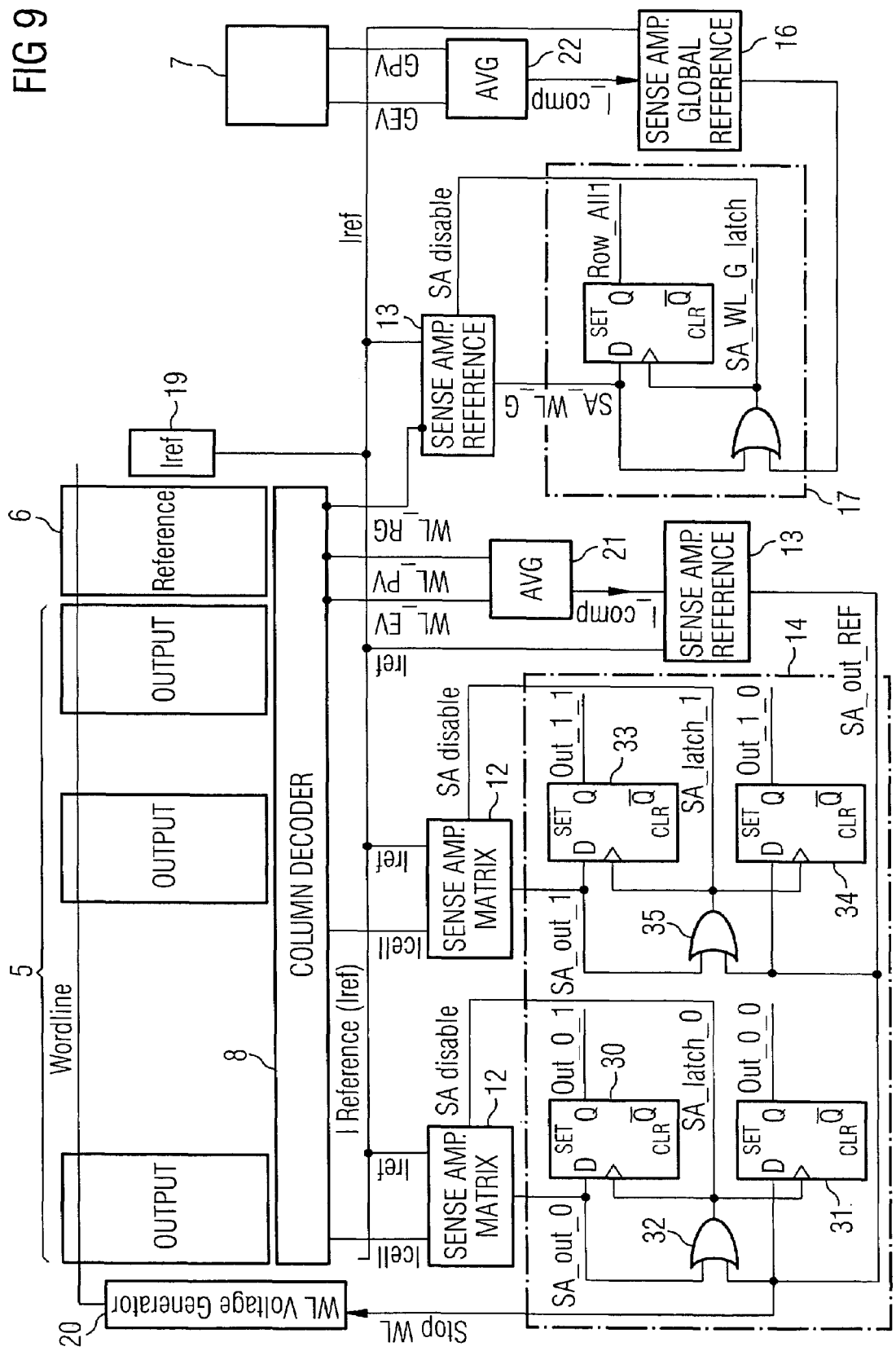
FIG. 9 is a detailed schematic of an extended embodiment of an evaluation circuit.
Figures 10, 11:
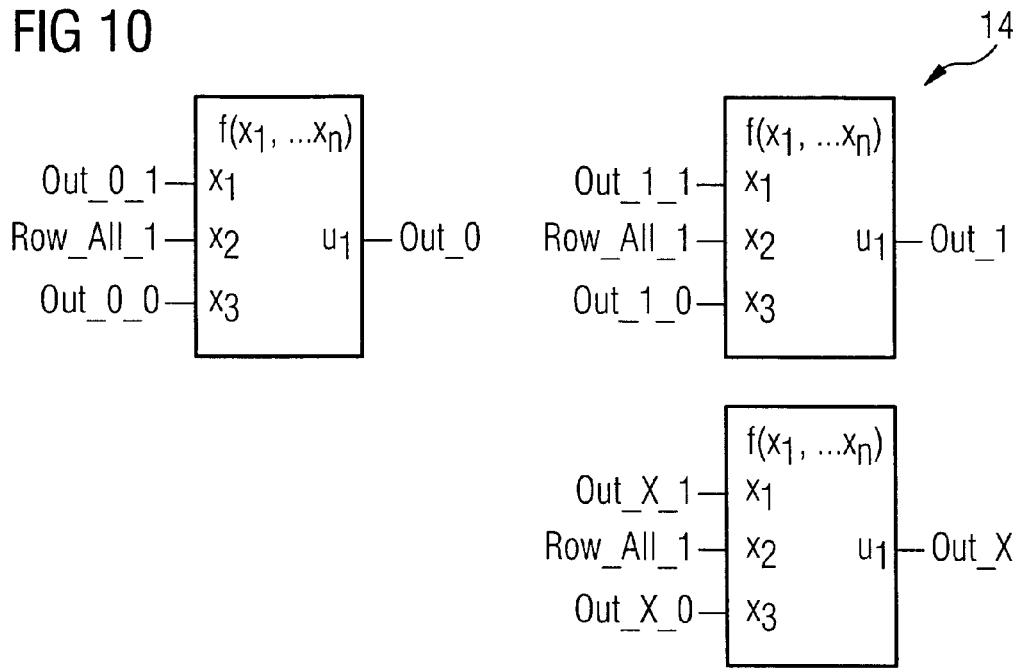
FIG. 10 shows output units for the schematic of FIG. 9.
FIG. 11 is a table with signal states of the circuit from FIGS. 9 and 10.

FIGS. 9 and 10 are an example of an extended embodiment of the invention. For reading data it is important that the states of the array reference cells are in a proper condition. After a block erase command it happens that also the array reference cells are in an erased state. When data are read using the erased reference cells, no correct reading result can be obtained. In the shown circuit an additional so-called row guard reference cell is used to detect if all cells assigned to a wordline are in an erased state. The row guard reference cell is an additional status cell that is cycled with the memory cells and the other array reference cells. That means that it is erased when a block erase command is carried out. When programming the first bit to a memory cell assigned to the same wordline the row guard reference cell is also programmed.

When reading data it is verified if the row guard reference cell is programmed. Otherwise, the reading result is always "erased" since an erased row reference cell indicates that all memory cells are erased. For this purpose an array reference sense amplifier 13 senses the current through the row guard reference cell by comparing it to the reference current I_REF, a main reference sense amplifier 16 senses a main comparative current through the main reference cells by comparing it to the reference current I_REF and a main evaluation circuit 17 detects the logical state of the row guard reference cell using the output signals of the sense amplifiers 13 and 16 and outputs a corresponding result signal ROW_ALL1.

The main comparative current is generated by an average generating circuit 22 that works in the same way as it was described with respect to FIG. 5.

In the table of FIG. 11 the different operation situations are listed. It can be seen that the output signal OUT_X is always '1' if the row guard reference cell is erased. In the case that the row guard reference cell is programmed the table entries correspond to those of the table of FIG. 8.

FIGS. 12 to 15 illustrate examples of reading timing in a circuit according to FIG. 7 or FIG. 9 as mentioned above.

Figure 16:
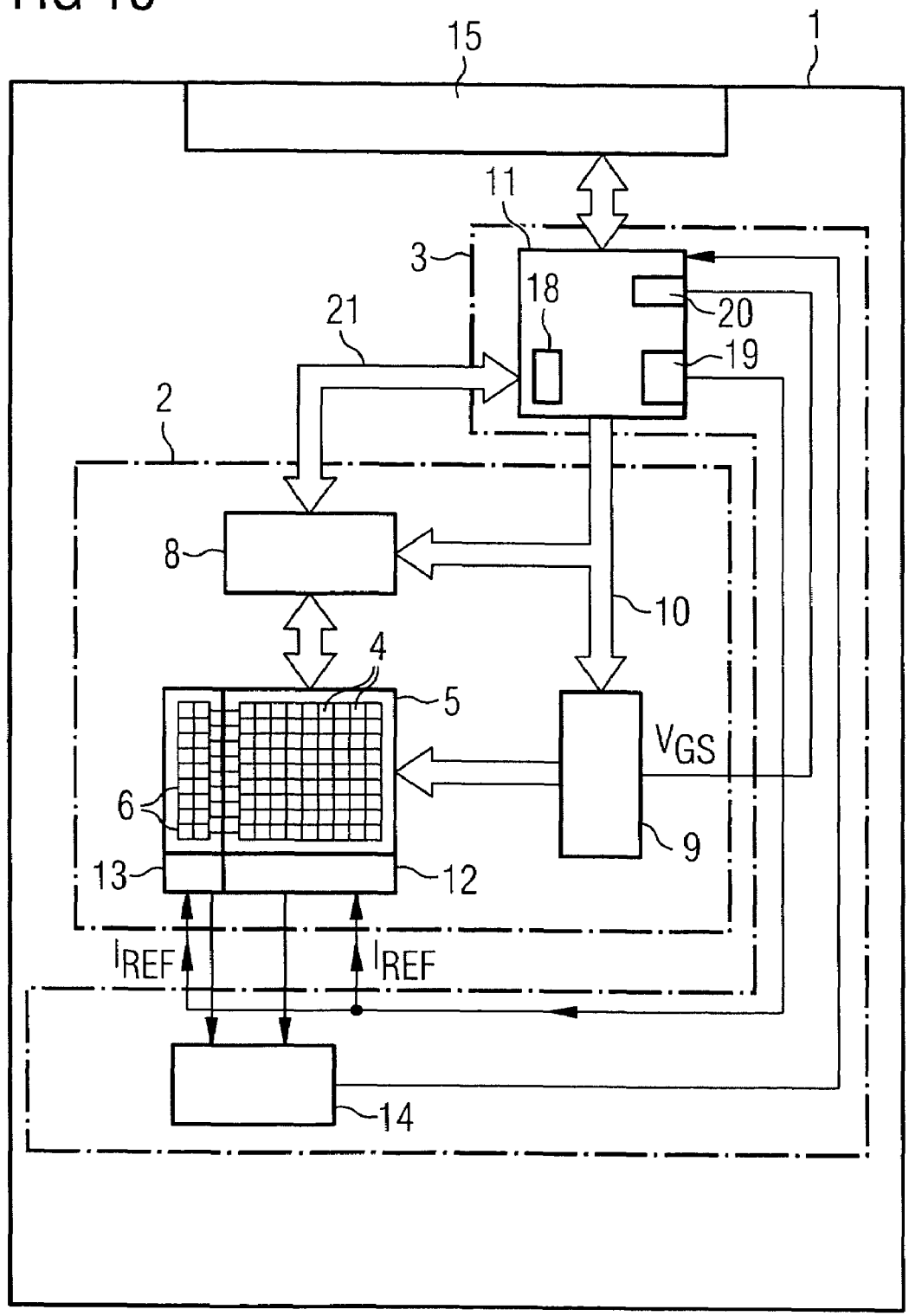
FIG. 16 is a schematic diagram of an improved flash memory circuit according to the present invention.

FIG. 16 is another embodiment of the invention. Most parts of the circuit are similar to the circuit shown in FIG. 1. According to this embodiment the reference cells are arranged next to the memory cells to be read. This is an additional advantage since they are treated as normal memory cells and, therefore, exhibit the same behavior in time and are subject to the same temperature variations. Also, all other kinds of disturbances effect the reference cells in the same manner as the memory cells. The respective memory cells are connected to the same wordline as the assigned memory cells. Therefore, the selection of a memory cell by activating a wordline also activates the respective array reference cell. For applying the variable gate voltage to the reference cells no additional control line is necessary since this is done via the wordline. This mechanism also assures that the current flowing through a memory cell and through a reference cell are measured at the same time.

In an advantageous embodiment of the invention, at least two reference cells are provided for each of the wordlines. During operation of the memory device one of the reference cells is configured to have a threshold value corresponding to an erased state of a memory cell and at least one other reference cell is configured to have a threshold voltage corresponding to a programmed state of a memory cell. A third reference cell can be provided and configured to have a threshold voltage corresponding to an over-erased state of a memory cell.

Figure 17:
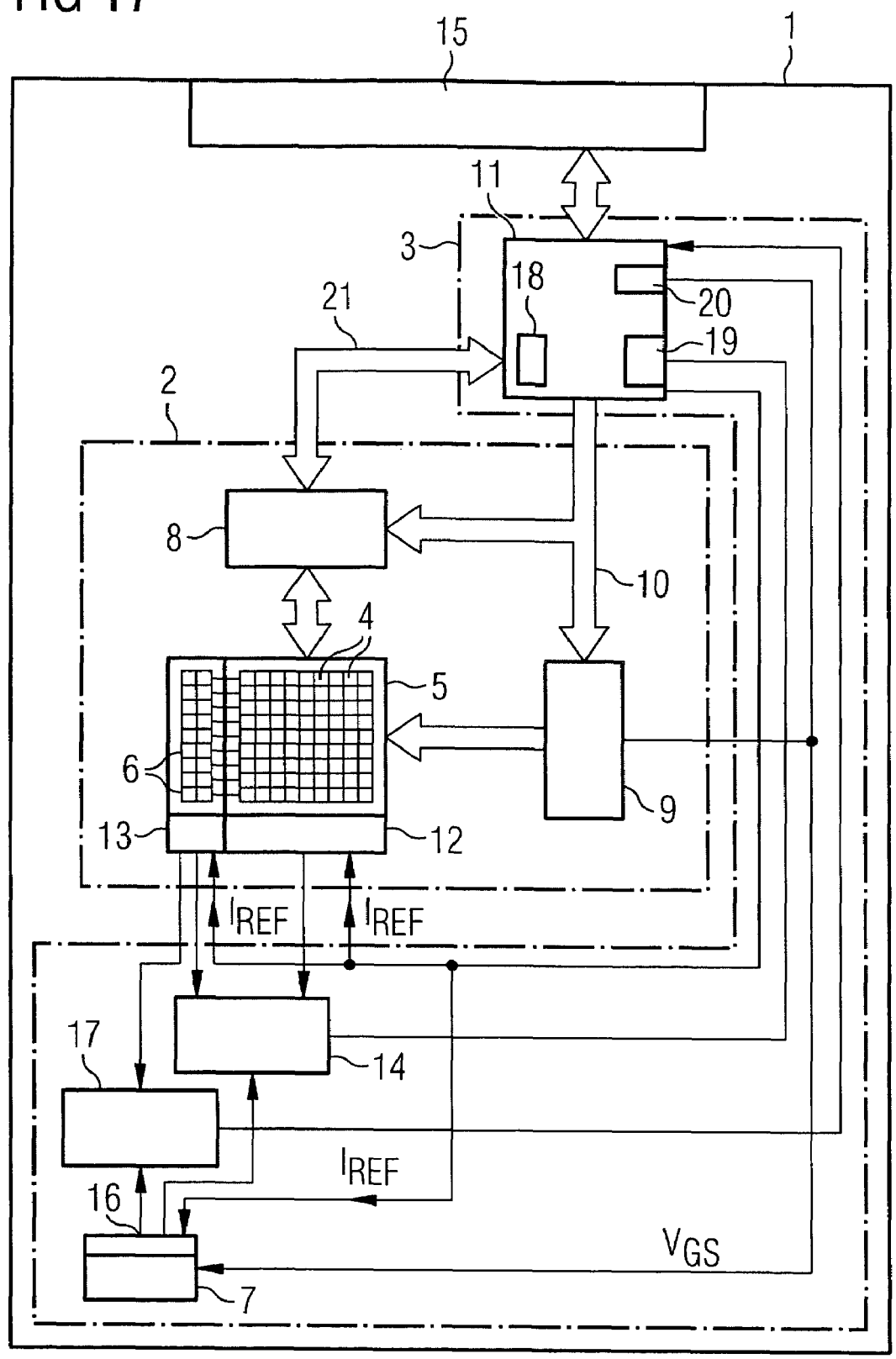
FIG. 17 is a schematic diagram of a further improved flash memory circuit according to the present invention.
Figure 18:
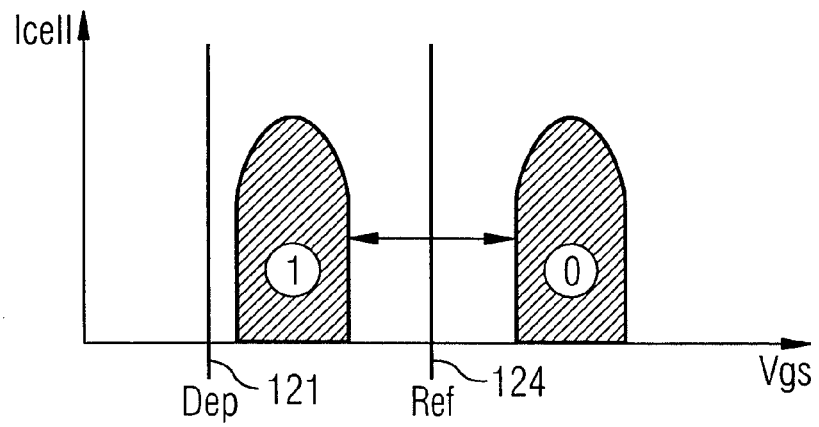
FIGS. 18, 19 and 20 are diagrams showing the necessity of sharp reference.
Figure 19:
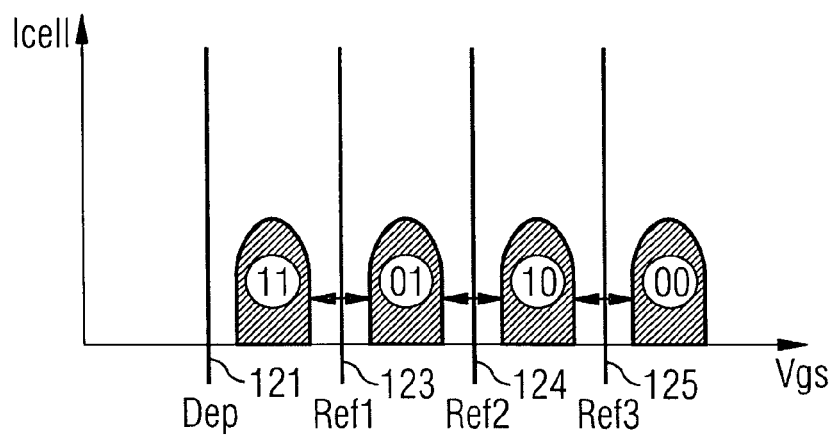
Figure 20:
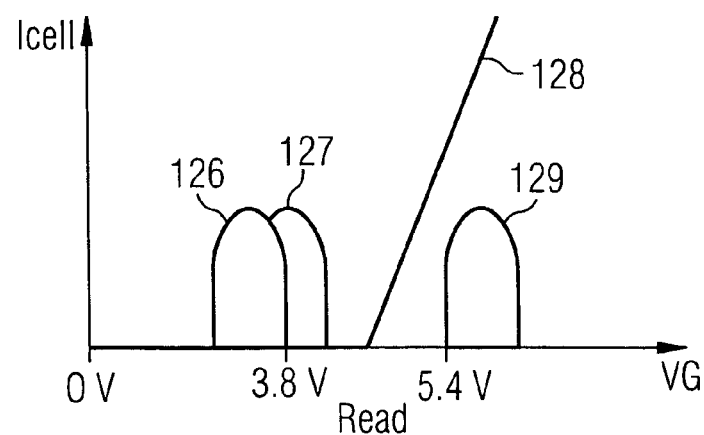

FIG. 17 is a further extended embodiment of the invention that is similar to the examples shown in FIGS. 1 and 16. For providing exact reference values it is proposed to provide main reference cells 7 that are used as a verify reference for writing reference values to the array reference cells 6. A main reference sense amplifier 16 is also connected to the array evaluation circuit 14. Therefore, cells of the memory array can also be read or verified using the main references.

For reading data stored in the memory cells the array reference cells 6 are used, since these provide references that are degraded in the same manner as the data stored in the memory cells. Additionally, this prevents the main reference cells from further stress that could degrade the threshold values of the reference cells. For writing data to the memory cells the main reference cells are used as a verify reference. During programming or erasing a memory cell, the actual state is sensed and verified against the main reference values for determining if additional erase or program pulses are required to reach the aimed state.

For setting the array reference values the same mechanism is implemented as already explained for the reading of memory cells. As described above, a current through an array reference cell 6 can be measured by the array reference sense amplifier 13. A current through the main reference cells 7 is measured by main reference sense amplifiers 16. Both sense amplifiers 13 and 16 are connected to a main evaluation circuit 17, which compares the values measured by the sense amplifiers 13 and 16 and outputs a signal indicating the logical state of a measured array reference cell 6.

In contrast to the reading or verifying of memory cells using the array reference cells, the main reference cells and the array reference cells are not connected to the same wordline. The main reference cells are controlled by an additional control signal.

Both the array evaluation circuit 14 and the main evaluation circuit 17 are connected to the control unit 11. For setting an array reference cell 6 to a dedicated state the actual state is detected by the sense amplifiers 13 and 16 and the main evaluation circuit 17. The state is reported to a writing circuit 18 of the control unit 11 and, if necessary, a writing operation is performed. After writing data to the array reference cell, a reading operation is performed to verify if the writing operation was sufficient to reach the state as required.

Other embodiments of the invention are subject to the knowledge of a person with ordinary skills in the art. Therefore, they are covered by the invention as claimed.

What is claimed is:

1. A method of sensing a state of a non-volatile semiconductor memory cell represented by a transistor having a gate, a drain and a source, the method comprising:
   a) providing a predefined reference current;
   b) providing at least one reference cell that is represented by a transistor having a gate, a drain and a source;
   c) providing a comparative current that is composed of cell currents of at least one reference cell;
   d) varying a voltage applied to the gates of said memory cell and said at least one reference cell;
   e) comparing a memory cell current of said memory cell with the predefined reference current and simultaneously comparing a reference cell current of said reference cell with the predefined reference current; and
   f) detecting which of said memory cell current and said reference cell current reaches first said predefined reference current when varying said gate voltages, the order of reaching the predefined reference current being indicative of the state of the memory cell.

2. The method according to claim 1, wherein:
   step e) comprises comparing said memory cell current with said predefined reference current using a first sense amplifier, said first sense amplifier generating a signal indicating when the memory cell current has reached a threshold defined by the reference current, and comparing said reference cell current with said predefined reference current using a second sense amplifier, said second sense amplifier generating a signal indicating when the reference cell current has reached a threshold defined by the reference current; and
   wherein step f) comprises detecting which of the signals of the first and the second sense amplifiers indicates first that the threshold defined by the reference current is reached.

3. The method according to claim 1, wherein the comparative current is generated from cell currents of an erased reference cell and a programmed reference cell.

4. The method according to claim 3, wherein the comparative current is in a range between 30% and 70% of the difference between the currents of the erased reference cell and the programmed reference cell.

5. The method according to claim 4, wherein the predefined reference current is in a range between about 5 μA and about 20 μA.

6. The method according to claim 5, wherein the predefined reference current is about 10 μA.

7. The method according to claim 1, wherein varying the voltage applied to the gates comprises varying the voltage monotonically.

8. The method according to claim 1, wherein varying the voltage applied to the gates comprises varying the voltage linearly.

9. A circuit for use with a semiconductor memory cell, the circuit comprising:
   a reference current source for providing a predefined reference current;
   a first sense amplifier for comparing a memory cell current with said reference current, said first sense amplifier outputting a first signal indicating when the memory cell current has reached a threshold defined by the reference current;
   a second sense amplifier for comparing a comparative current with said reference current, said second sense amplifier outputting a second signal indicating when said comparative current has reached a threshold defined by the reference current; and
   a detector receiving the first signal and the second signal and providing an output indicative of which of said memory cell current and said comparative current reaches the reference current first.

10. The circuit according to claim 9, wherein said comparative current comprises cell currents of at least one reference cell.

11. A semiconductor non-volatile memory device comprising:
   a plurality of memory cells;
   at least one reference cell for providing a comparative current for reading information stored in the memory cells;
   a reference current source for providing a predefined reference current;
   a control voltage generator coupled to a gate of at least one of said memory cells and to a gate of said at least one reference cell, the control voltage generator causing a varying voltage to be applied to the gates of said memory cell and said at least one reference cell;
   a first sense amplifier for comparing a memory cell current with said reference current, said first sense amplifier outputting a signal indicating when the memory cell current has reached a threshold defined by the reference current;
   a second sense amplifier for comparing said comparative current with said reference current, said second sense amplifier outputting a signal indicating when the comparative current has reached a threshold defined by the reference current; and
   a detector means for detecting which of said memory cell current and said comparative current reaches first said reference current when varying said gate voltages, the order of reaching the reference current being indicative of a memory cell state.

12. The memory device according to claim 11, wherein each memory cell comprises a Nitride-Read-Only-Memory-Cell (NROM).

13. The memory device according to claim 11, wherein the comparative current is generated from an erased reference cell current and a programmed reference cell current.

14. The memory device according to claim 13, wherein the comparative current is in a range between 30% and 70% of the difference between the erased reference current and the programmed reference current.

15. The memory device according to claim 14, wherein the predefined reference current is in a range between about 5 μA and about 20 μA.

16. The memory device according to claim 15, wherein the predefined reference current is about 10 μA.

17. The memory device according to claim 13, wherein said comparative current is generated from the erased reference cell current and the programmed reference cell current by means of an average generating circuit, simultaneously reading both of said currents using a common bitline, said average generating circuit comprising a current mirror with the bitline current as an input current having a ratio effecting that the output comparative current is between the erased reference cell current and the programmed reference current.

18. The memory device according to claim 11, wherein each memory cell includes a charge-trapping region, the charge-trapping region comprising an oxide-nitride-oxide memory layer sequence.

* * * * *